(12) United States Patent
Mahanpour

(10) Patent No.: US 6,304,792 B1
(45) Date of Patent: Oct. 16, 2001

(54) SEPARATION OF A MULTI-LAYER INTEGRATED CIRCUIT DEVICE AND PACKAGE

(75) Inventor: Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/193,189

(22) Filed: Nov. 17, 1998

(51) Int. Cl.[7] ....................................... G06F 19/00
(52) U.S. Cl. ............................. 700/121; 438/460; 29/762
(58) Field of Search .......................... 700/121; 257/691, 257/698, 666, 700, 737, 738; 438/15, 109, 125, 4, 460; 324/754, 757, 758, 158; 29/426.1, 426.4, 762

(56) References Cited

U.S. PATENT DOCUMENTS

| | | | |
|---|---|---|---|
| 4,593,243 | * | 6/1986 | Lao et al. ............................ 324/158 |
| 5,708,296 | * | 1/1998 | Bhansali ............................. 257/698 |
| 5,786,630 | * | 7/1998 | Bhansali et al. ..................... 257/697 |
| 5,786,701 | * | 7/1998 | Pedder ................................ 324/754 |
| 5,801,432 | * | 9/1998 | Rostoker et al. .................... 257/666 |
| 5,886,406 | * | 3/1999 | Bhansali ............................. 257/698 |
| 5,904,489 | * | 5/1999 | Khosropour et al. ................. 438/15 |
| 6,033,288 | * | 5/1999 | Weisshaus et al. ..................... 451/8 |
| 6,119,325 | * | 9/2000 | Black et al. ....................... 29/426.1 |

* cited by examiner

*Primary Examiner*—Paul P. Gordon
(74) *Attorney, Agent, or Firm*—Sawyer Law Group LLP

(57) ABSTRACT

Aspects for device and package separation of a multi-layer integrated circuit device attached at a frontside to an integrated circuit package are described. In an exemplary method aspect, the method includes cutting through coupling material between the multilayer integrated circuit and the integrated circuit package with a high precision saw blade. The method further includes cutting with a high precision saw blade of approximately 50 microns thickness. Additionally, the multi-layer integrated circuit device is utilized for device analysis from a frontside following separation from the integrated circuit package by the step of cutting.

18 Claims, 2 Drawing Sheets

SEPARATION OF A MULTI-LAYER INTEGRATED CIRCUIT DEVICE AND PACKAGE

FIELD OF THE INVENTION

The present invention relates to multi-layer integrated circuit (IC) devices, and more particularly to package separation of multi-layer IC devices attached at a frontside to the packages.

BACKGROUND OF THE INVENTION

For multi-layer IC devices attached at a frontside to packaging, e.g., oriented in a flip-chip orientation, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Testing of the circuit remains a challenge due to the upside-down nature of the flip-chip orientation. While the circuit may be approached through the backside layers, such techniques are usually not preferred due to the difficulties associated with having to access the layers in an unconventional order. Further, these techniques normally reduce the thickness of the device to reach the circuit, making the device extremely fragile and cumbersome to handle and utilize during testing.

Accordingly, a need exists for an efficient and effective procedure for separating an IC device from its package to allow utilization, such is testing, from a frontside. The present invention addresses such a need.

SUMMARY OF THE INVENTION

The present invention provides for device and package separation of a multi-layer integrated circuit device attached at a frontside to an integrated circuit package. In an exemplary method aspect, the method includes cutting through coupling material between the multi-layer integrated circuit and the integrated circuit package with a high precision saw blade. The method further includes cutting with a high precision saw blade of approximately 50 microns thickness. Additionally, the multi-layer integrated circuit device is utilized for device analysis from a frontside following separation from the integrated circuit package by the step of cutting.

Through the present invention, more efficient device and package separation is achieved. Further, the present invention provides a straightforward technique that utilizes minimal steps for separation with high precision to achieve direct cutting of the coupling material between the device and packaging. These and other advantages of the aspects of the present invention will be more fully understood in conjunction with the following detailed description and accompanying drawings.

DETAILED DESCRIPTION

The present invention relates to a procedure for separation of multi-layer integrated circuit coupled at a frontside to device packaging. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
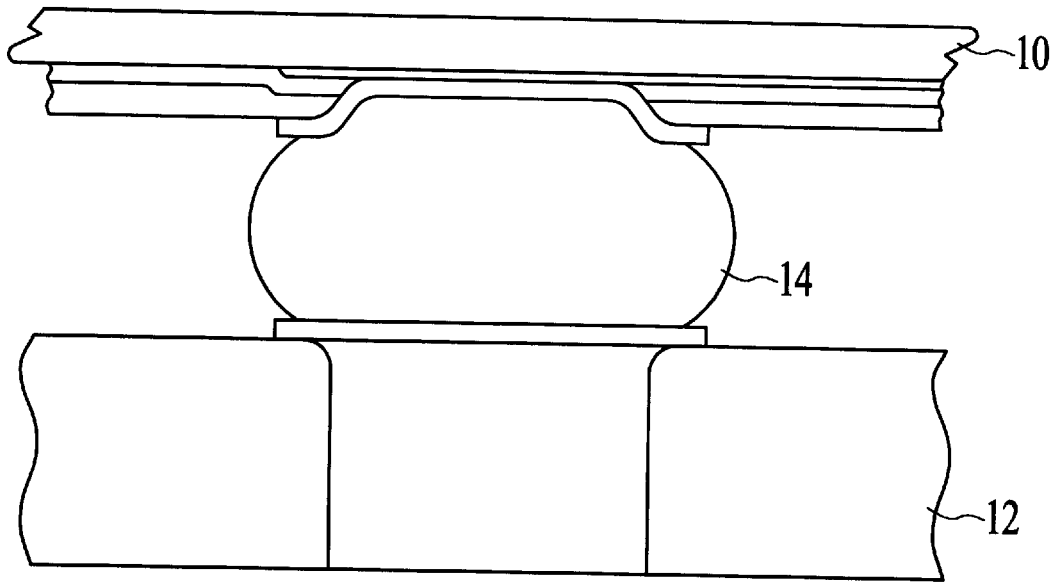
FIG. 1 illustrates a sideview diagram of a typical flip-chip multi-layer integrated circuit.
Figure 2:
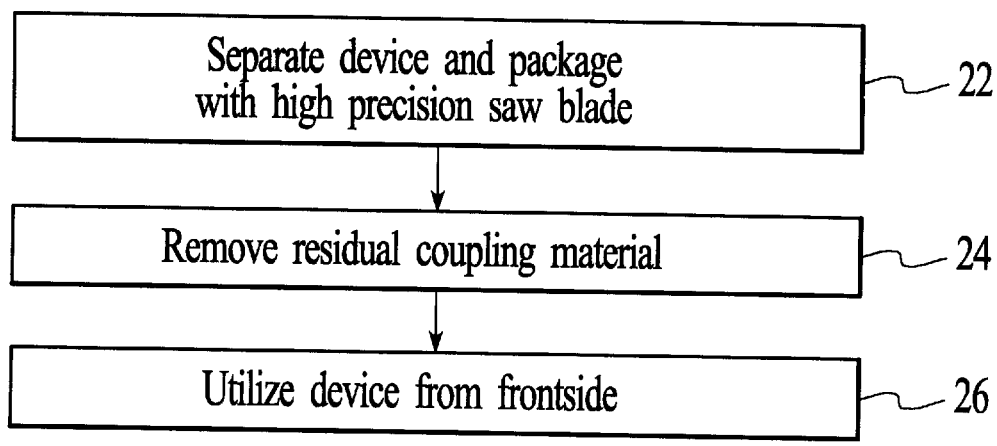
FIG. 2 illustrates a flow diagram of a procedure for separation of a multi-layer integrated circuit from its package in accordance with the present invention.
Figure 3:
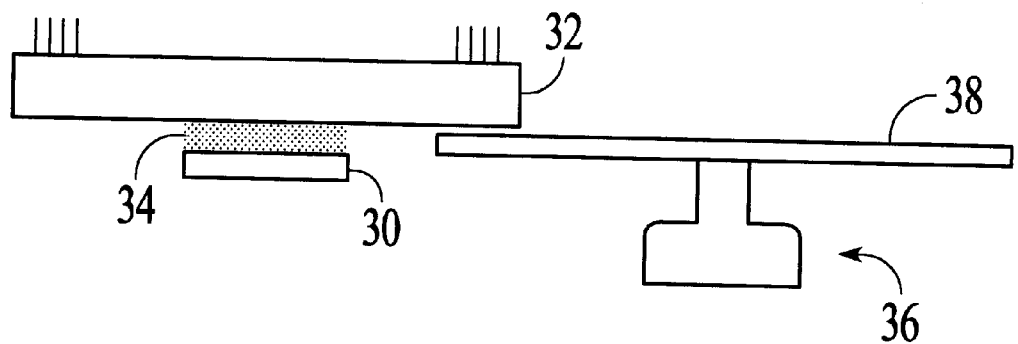
FIG. 3 illustrates a partial cross-section of the multi-layer integrated circuit device and package during the procedure illustrated in FIG. 2.

FIG. 2 illustrates a block flow diagram of a process for device and package separation in accordance with a preferred embodiment. The process initiates with separation of the device and package using a high-precision, thin saw blade to cut through the material coupling the device to the package (step 22). FIG. 3 illustrates a device 30 coupled to a package 32 via solder bumps 34. Commonly, underfill material (not shown), e.g., a polymer, is also provided between the device 30 and package 32 to add rigidity to the structure by substantially surrounding the solder bumps 34. Thus, the cutting suitably occurs through the coupling material of solder bumps and underfill material for the configuration of FIG. 3. FIG. 3 further illustrates a saw 36 with a thin, high precision saw blade 38, such as available from Allied High Tech of Rancho Dominguez, Calif. to perform the cutting. The saw 36 includes a sample holder (not shown) for supporting the device 30 and package 32 during the cutting of the solder bumps 34.

Figure 4:
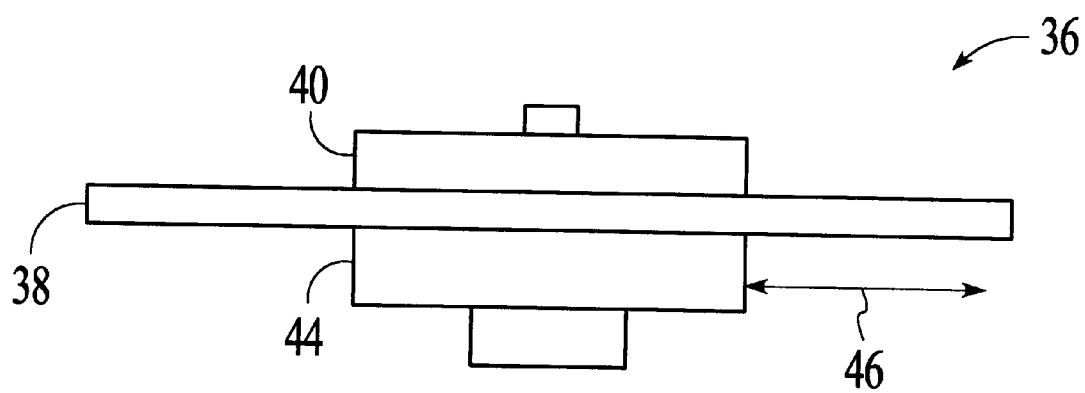
FIG. 4 illustrates an example of a saw for use in step 22 of FIG. 2.

By way of example, a preferred blade thickness is approximately 50 microns. Of course, this thickness is meant as illustrative of a thickness suitable for current coupling material and device conditions. Other thicknesses may be appropriate for other design needs, as is well appreciated by those skilled in the art. However, the thinness of the blade allows greater precision in cutting through the coupling material without harming the device 30. The cutting requires a high speed saw, e.g., of more than approximately 3000 RPM (revolutions per minute), for a duration of about three to four minutes for an average device configuration. The blade preferably comprises a stainless steel blade with a diamond coated carbide edge that does not wobble. FIG. 4 illustrates an example of a saw 36 that does not wobble. As shown, a suitable saw 36 includes a 2 inch flange portion 40 coupled to blade 38, e.g., a four inch blade, that is attached to a motor 44, with no more than about one inch between the edge of the blade 38 and of the motor 44, represented by arrow 46.

With the cutting through of the coupling material, the device 30 and package 32 are successfully separated. Any residual coupling material still on the device 30 may then be removed (step 24), using standard solder/underfill removal techniques, such as through chemical removal. The device 30 is then utilized as desired (step 26), for example, to perform device analysis and debugging from a frontside using well-established, standard analysis techniques.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for device and package separation of a multi-layer integrated circuit device attached at a frontside to an integrated circuit package, the method comprising:

cutting through coupling material between the multi-layer integrated circuit device and the integrated circuit package with a high precision saw blade.

2. The method of claim 1 wherein cutting further comprises cutting with a high precision saw blade of approximately 50 microns thickness.

3. The method of claim 1 wherein cutting further comprises cutting through solder bump material.

4. The method of claim 3 wherein cutting through solder bump material further comprises cutting through underfill material substantially surrounding the solder bump material.

5. The method of claim 1 further comprising removing residual coupling material from the multi-layer integrated circuit device after the step of cutting.

6. The method of claim 5 wherein removing residual coupling material further comprises chemically removing the residual coupling material from the multi-layer integrated circuit device.

7. The method of claim 1 further comprising utilizing the multi-layer integrated circuit device for device analysis from a frontside following separation from the integrated circuit package by the step of cutting.

8. A multi-layer integrated circuit device arrangement comprising:

an integrated circuit package;

a multi-layer integrated circuit device coupled to the integrated circuit package at a frontside through predetermined coupling material; and a high precision saw blade for sawing through the predetermined coupling material to separate the multi-layer integrated circuit device from the integrated circuit package and allow access to the frontside of the multi-layer integrated circuit device.

9. The arrangement of claim 8 wherein the high precision saw blade further comprises a saw blade with a thickness of approximately 50 microns.

10. The arrangement of claim 8 wherein the predetermined coupling material comprises solder bump material.

11. The arrangement of claim 10 wherein the predetermined coupling material further comprises underfill material substantially surrounding the solder bump material.

12. The arrangement of claim 8 wherein the integrated circuit package comprises a C4 package.

13. A method for accessing a multi-layer integrated circuit device oriented in a flip-chip orientation from a frontside, the method comprising:

cutting with a high precision saw blade through solder bump material coupling the multi-layer integrated circuit device at the frontside to a flip-chip package;

removing residual solder bump material from the multi-layer integrated circuit device; and utilizing the multi-layer integrated circuit device from the frontside.

14. The method of claim 13 wherein cutting further comprises cutting with a saw blade approximately 50 microns thick.

15. The method of claim 13 wherein cutting through solder bump material further comprises cutting through underfill material substantially surrounding the solder bump material.

16. The method of claim 15 wherein removing residual solder bump material further comprises removing residual underfill material.

17. The method of claim 13 wherein removing residual solder bump material further comprises chemically removing the solder bump material.

18. The method of claim 13 wherein utilizing the multi-layer integrated circuit device from a frontside further comprises performing device analysis from the frontside.

* * * * *